(12) United States Patent
Sumi

(10) Patent No.: US 6,711,793 B2
(45) Date of Patent: Mar. 30, 2004

(54) METHOD OF PRODUCING A PIEZOELECTRIC DEVICE HAVING AT LEAST ONE PIEZOELECTRIC THIN FILM LAYER

(75) Inventor: Kouji Sumi, Nagano (JP)

(73) Assignee: Seiko Epson Corporation (JP)

( * ) Notice: Subject to any disclaimer, the term of this patent is extended or adjusted under 35 U.S.C. 154(b) by 10 days.

(21) Appl. No.: 10/107,744

(22) Filed: Mar. 27, 2002

(65) Prior Publication Data

US 2002/0097305 A1 Jul. 25, 2002

Related U.S. Application Data

(62) Division of application No. 09/345,405, filed on Jul. 1, 1999, now Pat. No. 6,402,303.

(30) Foreign Application Priority Data

Jul. 1, 1998 (JP) .............................. 10-186679
Jun. 10, 1999 (JP) .............................. 11-163867

(51) Int. Cl.[7] .......................... H04R 17/00; B41J 2/045; B05D 5/12
(52) U.S. Cl. ....................... 29/25.35; 29/890.1; 347/71; 347/68; 427/100; 427/126.3
(58) Field of Search ............................ 29/25.35, 890.1; 347/68, 328, 71; 428/450; 427/100, 123, 226, 229, 228, 126.3, 126.5, 126.6

(56) References Cited

U.S. PATENT DOCUMENTS

| | | | |
|---|---|---|---|
| 5,391,393 A | * | 2/1995 | Maniar ........................... 438/3 |
| 5,453,294 A | * | 9/1995 | Ogi et al. .................... 427/100 |
| 5,530,465 A | * | 6/1996 | Hasegawa et al. ............. 347/70 |
| 5,650,362 A | * | 7/1997 | Nashimoto ............... 427/126.3 |
| 5,683,614 A | * | 11/1997 | Boyle .................... 252/62.9 R |
| 5,719,607 A | | 2/1998 | Hasegawa |
| 5,802,686 A | * | 9/1998 | Shimada et al. ........... 29/25.35 |
| 6,103,072 A | * | 8/2000 | Nishiwaki et al. ..... 204/192.18 |

FOREIGN PATENT DOCUMENTS

| | | |
|---|---|---|
| JP | 57-93160 | 6/1982 |
| JP | 6-112543 | 4/1994 |
| JP | 6-112550 | 4/1994 |

OTHER PUBLICATIONS

Klee, M., et al., "Analytical Study of the Growth of Polycrystalline Titanate Thin Films," Philips Journal of Research vol. 47, Nos. 3–5:263–285 (1993).

XU, W–Ping, et al., "Application of Hydrothermal Mechanism for Tailor–Making Perovskite Titanate Films", IEEE Proc. of the 9th Int'l., Symp. on Electrets, Shanghai, China, Sep. 25–30, pp. 617–622 (1996).

Patent Abstracts of Japan, English Language Abstract of Japanese Publication No. 57–93160, published Jun. 1982 and entitled "Ink Drop Injector."

* cited by examiner

*Primary Examiner*—Carl J. Arbes
*Assistant Examiner*—Tai V Nguyen
(74) *Attorney, Agent, or Firm*—Sterne, Kessler, Goldstein & Fox P.L.L.C.

(57) ABSTRACT

A method to produce a piezoelectric device having one or more piezoelectric thin film layers and two or more electrode layers. The method comprises forming an amorphous electrode layer, forming a least one amorphous piezoelectric thin film layer over the amorphous electrode layer and forming a second electrode layer over at least one piezoelectric thin film layer. Then, the amorphous piezoelectric thin film layers and the amorphous electrode layers are crystallized by hydrothermal synthesis. The hydrothermal synthesis is not performed until all of the amorphous layers are deposited.

9 Claims, 5 Drawing Sheets

METHOD OF PRODUCING A PIEZOELECTRIC DEVICE HAVING AT LEAST ONE PIEZOELECTRIC THIN FILM LAYER

This is a divisional of application No. 09/345,405, filed Jul. 1, 1999, now U.S. Pat. No. 6,402,303.

BACKGROUND OF THE INVENTION

1. Field of the Invention

The present invention pertains to a method of producing a piezoelectric device used in ink jet recording heads, etc., and in particularly, to a method of producing a piezoelectric device, etc., by means of which crystallization of the entire layer-built structure can be performed all at once and productivity thereby raised, and its products.

2. Description of the Related Art

Piezoelectric devices are elements with electric equipment conversion capability and are made by sandwiching a piezoelectric ceramic such as crystalline lead zirconate titanate (PZT), etc., between electrodes. In order to produce this piezoelectric device, a diaphragm layer, bottom electrode layer, piezoelectric thin film layer, and a top electrode layer are formed in succession on a substrate. By means of methods of producing piezoelectric devices in general, a different method is used to produce each layer because the composition of each layer is different. For instance, the diaphragm is formed by the thermal oxidation method, while the electrode layers are formed by sputtering, etc. Moreover, the so-called sol-gel method is used to produce the piezoelectric thin film layer. By means of the sol gel method, a sol, or the organic metal precursor, is applied, the sol is dried and pyrolyzed, and finally, the product is heat treated at a high speed and thereby crystallized.

Methods of producing thin films in general are further discussed in, for instance, Phillips J. Res. 47('93), pp. 263–285, etc.

Nevertheless, by means of conventional methods of producing piezoelectric devices, the thin film of one layer is completed and then the film of the next layer is formed and therefore, there is a problem in that the structure of each layer is completely crystallized and adhesion between the layers is weak. When adhesion between the layers is poor, peeling occurs during the production process, leading to poor yield, and peeling occurs during use, resulting in poor reliability. Therefore, there is a demand for a method of production that results in strong adhesion.

Moreover, since each layer is as it is being crystallized, there are inevitably many processes needed to complete the piezoelectric structure. Because there are many processes, there is naturally an increase in the production cost. Therefore, there is a demand for a production method with few processes.

SUMMARY OF THE INVENTION

Thereupon, a method whereby a piezoelectric device of a piezoelectric ceramic that has been applied to a substrate and pyrolyzed is placed in a specific alkali solution and crystallized is recorded in "Application of Hydrothermal Mechanism for Tailor-Making Perovskite Titanate Films," IEEE Proc. of the 9th Int'l Symp. on Electrets, Shanghai, China, September 25–30, pp. 617–622 (1996), W-ping Xu, Masanori Okuyama, et al. This method of crystallization in an alkali solution is called the hydrothermal method. When compared to the sol-gel method, crystallization at a relatively low temperature is possible by means of this hydrothermal method and therefore, there are a number of advantages to this method. The inventors of the present invention hit upon the idea that a piezoelectric device with a multilayered structure could be crystallized all at once by using this hydrothermal method and successfully completed experiments with this production method confirming this point.

In light of the aforementioned facts, the first problem of the present invention is to present a functional thin film with high adhesion between layers and high reliability, a piezoelectric device, an ink jet recording head and a printer.

The second problem of the present invention is to present a method of producing a piezoelectric device and a method of producing an ink jet recording head, both of which have fewer production processes than conventional production methods and therefore have a lower production cost.

The invention that solves the aforementioned first problem is a functional thin film, characterized in that a mixed layer where the components of thin film layers made of different components are mixed together is formed between the respective thin film layers. This film is not only "functional thin film," but also film that is used for any purpose for which many thin films are used. There is a region of a specific thickness where the components of two layers are mixed at the interface between the respective layers of the thin film structure.

Another invention that solves the aforementioned first problem is a piezoelectric device, characterized in that it comprises at least 1 piezoelectric thin film layer and 2 electrode layers, and a mixed layer that is a mixture of the components of adjacent layers is formed between the respective layers. The crystals of the two layers are intricately intertwined in the mixed layer and therefore, adhesion between the layers is high.

Still another invention that solves the aforementioned first problem is a piezoelectric device that further comprises at least 1 diaphragm layer, with a mixed layer that is a mixture of the components of the aforementioned diaphragm layer and the adjacent electrode layer formed in between the respective layers.

Thickness of the aforementioned mixed layers is, for instance, 5 nm or thicker. By means of conventional production methods, thickness of the part where the compositions are mixed was less than 3 nm and therefore, adhesion between layers is improved by the presence of this thick mixed layer.

For instance, the metal alkoxide that comprises the piezoelectric thin film layers is any piezoelectric ceramic selected from lead zirconate titanate $(Pb(Zr, Ti)O_3$: PZT), lead lanthanum titanate $((Pb, La)TiO_3)$, lead lanthanum zirconate $((Pb, La)ZrO_3)$, lead lanthanum zirconate titanate $((Pb, La)(Zr, Ti)O_3$: PLZT), or lead magnesium niobate zirconate titanate $(Pb(Mg, Nb)(Zr, Ti)O_3$: PMN—PZT).

For instance, the piezoelectric device of the present invention has 2 or more piezoelectric thin film layers and 3 or more electrode layers and is made by sandwiching at least one of the piezoelectric thin films between electrode layers. This type of structure is generally called a bimorph.

Still another invention that solves the aforementioned first problem is an ink jet recording head with the piezoelectric device of the present invention as the piezoelectric actuator. For instance, it has a) a pressure chamber substrate that forms the pressure chamber, b) a diaphragm on one side of the pressure chamber, and c) a piezoelectric device that is placed facing the diaphragm in the pressure chamber and is made so that it deforms the aforementioned diaphragm.

Another invention of the present application that solves the aforementioned first problem is a printer that has the ink jet recording head of the present invention as a printing means. For instance, it has a) a recording medium conveyor that is made so that it is possible to feed in and carry out the recording medium and b) a head control circuit by means of which the ink jet recording head prints at any desired position on the recording medium that has been fed by the recording medium conveyor.

Still another invention that solves the aforementioned second problem is a method of producing a piezoelectric device with at least one piezoelectric thin film layer and at least 2 electrode layers, characterized in that it comprises a) the process whereby amorphous piezoelectric thin film layers, which are the amorphous state of each of the piezoelectric thin film layers, are formed, b) the process whereby amorphous electrode layers, which are the amorphous state of each of the electrode layers, are formed, and c) the process whereby after each amorphous piezoelectric thin film layer and each amorphous electrode layer have been laminated, hydrothermal synthesis is performed to crystallize the amorphous piezoelectric thin film layers and the amorphous electrode layers.

Moreover, another invention that solves the abovementoned second problem is a method of producing a piezoelectric device that further comprises at least one diaphragm. This method further comprises the process whereby an amorphous diaphragm, which is the amorphous state of the diaphragm layer, is formed and whereby once the amorphous diaphragm layer, as well as each of the amorphous piezoelectric thin film layers and each of the amorphous electrode layers, have been laminated, the aforementioned amorphous diaphragm, amorphous piezoelectric thin film layers, and amorphous electrode layers are crystallized by hydrothermal synthesis in the process of hydrothermal synthesis.

For instance, the aforementioned process of forming the amorphous piezoelectric thin film layer comprises the process whereby precursor made from an organic metal solution is applied by the sol-gel method, the MOD (metal-organic deposition) method, or the coprecipitation method and the process whereby said precursor is dried and pyrolyzed.

For example, by means of the process whereby the aforementioned precursor is dried and pyrolyzed, the precursor is dried at 150° C. to 200° C. and the dried precursor is pyrolyzed at 300° C. to 500° C.

By means of the aforementioned hydrothermal synthesis process, for instance, the pyrolyzed precursor is immersed in a specific alkaline solution and crystallization is promoted under specific conditions.

The aforementioned alkaline solution here comprises any of $KOH$, $Ba(OH)_2$, $Ba(OH)_2+Pb(OH)_2$ or $KOH+Pb(OH)_2$.

The aforementioned specific conditions of the hydrothermal process are for instance, a temperature of 100° C. to 200° C. and pressure of 10 atmospheres or less.

By means of the present invention, a structure is made whereby amorphous piezoelectric thin film layers are sandwiched by amorphous electrode layers by repeating the process whereby the aforementioned piezoelectric thin film layers are formed at least 2 times or more and repeating the process whereby the aforementioned amorphous electrode layers are formed at least 3 times or more.

Moreover, yet another invention that solves the aforementioned second problem is a method of producing an ink jet recording head comprising the piezoelectric device made by the production method of the present invention, and is a method of producing an ink jet recording head comprising a) the process whereby a diaphragm is formed on one surface of a substrate, b) the process whereby a piezoelectric device is made on the diaphragm, and c) the process whereby the substrate is etched and a pressure chamber is formed so that the diaphragm with the piezoelectric device will form one side of the pressure chamber.

DESCRIPTION OF THE PREFERRED EMBODIMENTS

Next, embodiments of the present invention will be described while referring to figures. The present embodiment describes the layer structure of a piezoelectric device as a functional thin film. It pertains to a piezoelectric device that was produced by the hydrothermal method, and an ink jet recording head and printer that use this element.

First Embodiment

Figure 5:
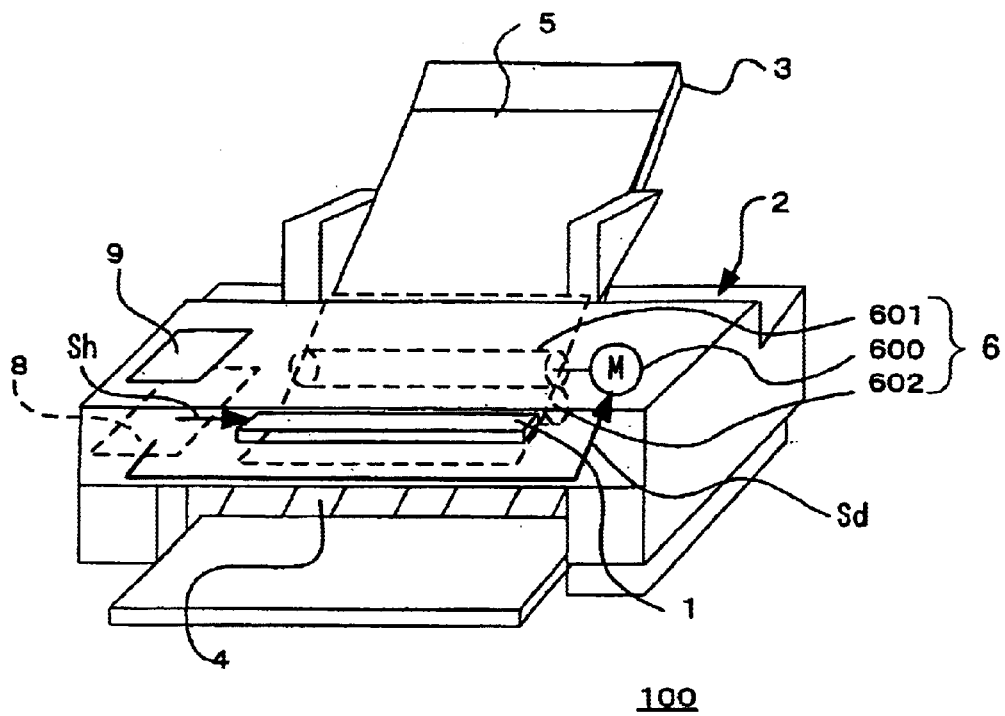
FIG. 5 is an oblique view describing that structure of the printer of the present invention.

First, the structure of a printer that uses an ink jet recording head with the piezoelectric device of the present invention will be described. As shown in FIG. 5, the printer of this embodiment has tray 3, paper outlet 4, and operating button 9 in body 2 so that it can function as a line printer. Ink jet recording head 1, feed mechanism 6, and control circuit 8 further comprise the inside of body 2.

Ink jet recording head 1 comprises the piezoelectric device made by the method of the present invention. This head 1 is a head for line printers in particular and is formed at a length that will cover the width of the paper that can be fed. That is, this head is formed to a size (length) not possible with conventional printers by using the production method of the present invention. Ink jet recording head 1 is made so that ink is sprayed from a nozzle that is set at the width of the paper that will be used in accordance with spray signals Sh that are fed from control circuit 8.

Body 2 is the receptacle for head 1. Feed mechanism 6 is placed so that it can feed paper 5 from tray 3 and ink jet recording head 1 for line printers is placed so that it can print over the entire width of paper 5. Tray 3 is made so that paper 5 can be fed to feed mechanism 6 before printing and paper outlet 4 is the opening from which paper 5 that has been printed is retrieved.

Feed mechanism 6 comprises motor 600, rollers 601 and 602 and a mechanical structure not shown. Motor 600 is made so that it can turn in response to the drive signals Sd fed from control circuit 8. The mechanical structure is made so that the turning force of motor 600 can be transmitted to rollers 601 and 602. Rollers 601 and 602 turn when the turning force from motor 600 is transmitted and paper 5 mounted in tray 3 is thereby pulled by this turning and fed so that it can be printed with head 1.

Although not shown, control circuit 8 comprises a CPU, ROM, RAM, interface circuit, etc., and is such that drive signals Sd can be fed to drive mechanism 6 and spray signals Sh can be fed to ink jet recording head 1 in response to printing data obtained from a computer via a connector, which is not shown. Moreover, control circuit 8 is such that the drive mode can be set and reset, etc., in response to the operating signals from operating panel 9.

Figure 6:
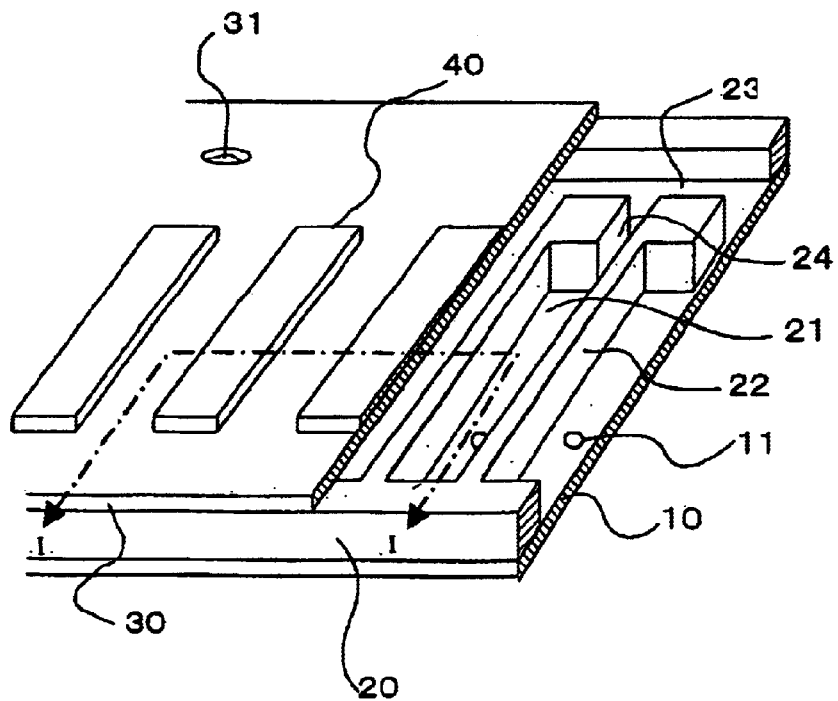
FIG. 6 is a partial oblique cross section of the ink jet recording head of the present invention.

Next, the structure of the ink jet recording head of the present invention will be described. Ink jet recording head 1 comprises nozzle 10, pressure chamber substrate 20, and diaphragm 30, as shown in the oblique and partial cross section diagram of the main part in FIG. 6. This head is an on-demand piezoelectric jet head. However, the head of the present invention is not limited to an on-demand head and it can also be a continuous printer head with which ink is continually sprayed and deposition of the ink is controlled by a deflecting electrode, or it can be a bubble head with which ink is sprayed by air bubbles.

Pressure chamber substrate 20 comprises cavity (pressure chamber) 21, side (wall) 22, reservoir 23, and feed opening 24. Cavity 21 is the cavity for the ink that will be sprayed, etc., and is formed by etching a substrate made of silicon, etc. Wall 22 is made so that it divides cavity 21 in two. Reservoir 23 is the flow path for filling ink in each cavity 21. Feed opening 24 is formed so that it is possible to introduce ink from reservoir 23 into each cavity 21.

Furthermore, the shape of cavity 21, etc., can be changed in accordance with the ink jet system. For instance, it can be a flat Kyser shape or a cylindrical Zoltan shape. Moreover, the cavities can be 1-chamber or 2-chamber cavities.

Nozzle plate 10 is glued to one side of pressure chamber substrate 20 so that its nozzle hole 11 corresponds to each cavity 21 in pressure chamber substrate 20. Pressure chamber substrate 20 to which nozzle plate 10 has been glued is further held in a receptacle that is not illustrated to complete ink jet recording head 1.

Diaphragm 30 is glued to the other side of pressure chamber substrate 20. Piezoelectric device 40 is placed at this diaphragm 30. Ink tank opening 31 is placed at this diaphragm so that the ink held in the ink tank, which is not illustrated, can be fed to inside pressure chamber substrate 20.

Figure 1:
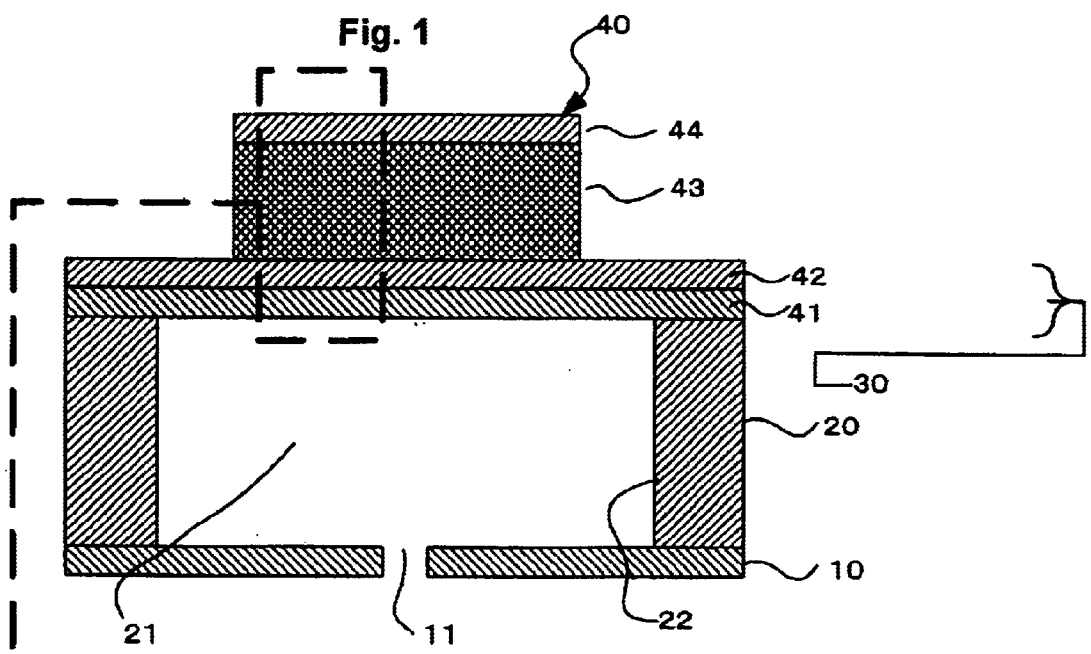
FIG. 1 is a cross section that describes the layer structure of the piezoelectric device of the first embodiment.

FIG. 1 shows a cross section that further explains the actual structure of the ink jet recording head and piezoelectric device of the present invention. This cross section is an enlarged view of the cross section of one of the piezoelectric devices in the layered structure as seen from A-A in FIG. 6. As shown in the top of FIG. 1, diaphragm 30 is made by building diaphragm layer 41 and bottom electrode layer 42, and piezoelectric device 40 is made by layering piezoelectric thin film layer 43 and top electrode layer 44. In particular, this ink jet recording head 1 is made with piezoelectric device 40, cavity 21 and nozzle 11 communicating at a constant pitch so that the entire width of the paper to be printed can be covered. This pitch to the nozzle can be changed as needed in accordance with the desired printing precision. For instance, it is set to obtain 400 dpi.

Diaphragm layer 41 is made from a material that is not conductive, such as silicon dioxide ($SiO_2$) and zirconium oxide ($ZrO_2$), etc., and is made so that it can deform when voltage is applied to the piezoelectric layer and thereby instantly increase the pressure inside cavity 21. It must be made from a material that can be crystallized by hydrothermal synthesis if the diaphragm layer is to be crystallized by hydrothermal synthesis.

Bottom electrode layer 42 is one electrode for applying voltage to the piezoelectric layer and it is made from a material that is conductive, such as tin oxide (SnO) or vanadium oxide ($VO_2$), etc. A material that can be crystallized by hydrothermal synthesis is particularly necessary. Bottom electrode layer 42 is formed in the same region as diaphragm layer 41 so that it can serve as a common electrode to several piezoelectric devices 40 formed on pressure chamber substrate 20. However, it can also be formed to the same size as piezoelectric thin film layer 43, that is, to the same shape as top electrode 44. Top electrode layer 44 is the other electrode for applying voltage to the piezoelectric layers and it is made from a material that is conductive, such as tin oxide (SnO) or vanadium oxide ($VO_2$), etc. It must be a material that can be crystallized by hydrothermal synthesis.

Piezoelectric device 40 is made from crystals of a piezoelectric ceramic with, for instance, a perovskite structure, and is formed to a specific shape on diaphragm 30. In particular, piezoelectric thin film 43 of the present invention is crystallized by the hydrothermal method and therefore, crystal grains with a columnar shape (columnar crystal grains) either display [110] orientation in the direction of film thickness, or they take on inconsistent random orientation in the direction of the crystals. For instance, these columnar crystal grains have a width parallel to the electrode film, that is, an average grain diameter, within a range of 100 nm to 15,000 nm. The face of piezoelectric thin film 43 that will connect with top electrode layer 44 is smooth in comparison to conventional hydrothermal treatment. For instance, maximum height of surface roughness is 20 nm or less. It is characterized in that there is little surface roughness due to the fact that this hydrothermal method is used concomitantly with the sol-gel method.

The composition of the piezoelectric thin film layers is, for instance, any piezoelectric ceramic selected from lead zirconate titanate (Pb (Zr, Ti)$O_3$: PZT), lead lanthanum titanate ((Pb, La)Ti$O_3$), lead lanthanum zirconate ((Pb, La)Zr$O_3$), lead lanthanum zirconate titanate ((Pb, La)(Zr, Ti)$O_3$: PLZT), or lead magnesium niobate zirconate titanate (Pb(Mg, Nb)(Zr, Ti)$O_3$; PMN—PZT). However, the present invention is characterized in its production method and the piezoelectric film layers are not limited to the aforementioned composition.

As shown in the middle of FIG. 1, a characterizing point of the structure of the piezoelectric device of the present invention is that it comprises mixed layers that are mixtures of the composition of two layers between each of these layers. For example, mixed layer 512 is in between diaphragm layer 41 and bottom electrode layer 42, mixed layer 523 is in between bottom electrode layer 42 and piezoelectric thin film layer 43, and mixed layer 534 is in between piezoelectric thin film layer 43 and top electrode layer 44. These mixed layers form interface areas where the crystal grains in the upper and lower layers are mixed together, as shown in the bottom of FIG. 1. This mixed layer is formed by mixing the two compositions together and promoting crystallization when the layers are laminated in an amorphous state in accordance with the production method described below.

The printing operation will now be described using ink jet recording head 1 with the aforementioned piezoelectric device 40. When drive signals Sd are output from control circuit 8, drive mechanism 6 is turned on and conveys paper 5 to where it can be printed by head 1. If spray signals Sh are not fed from control circuit 8, voltage will not be applied to piezoelectric device 40 between bottom electrode layer 42 and top electrode layer 44 and as a result, there will be no deformation of piezoelectric thin film layer 43. Therefore, there will be no changes in pressure in cavity 21 where piezoelectric device 40 is placed when spray signals Sh are not fed and ink drops will not be sprayed from nozzle hole 11.

On the other hand, when spray signals Sh are fed from control circuit 8 and constant voltage is applied to piezoelectric device 40 between bottom electrode layer 42 and top electrode layer 44, deformation of piezoelectric thin film layer 43 occurs. Diaphragm 30 will bend considerably in cavity 21 where piezoelectric device to which spray signals have been fed is set up. Therefore, pressure inside cavity 21 instantly increases and ink droplets are sprayed from nozzle hole 11. Spray signals Sh can be individually fed to piezoelectric devices where printing has been performed by fine heads making it possible to print any character or figure.

Description of Production Methods

Next, the method of producing the piezoelectric device will be described together with the method of producing the ink jet recording head. FIG. 2 is cross section diagrams showing the process of producing this piezoelectric device.

Figure 2A:
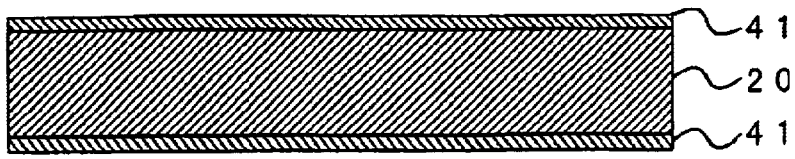
FIG. 2 is a cross section of the production process that describes the method of producing a piezoelectric device of the present invention.

Process of Diaphragm Layer Formation (FIG. 2A)

The diaphragm layer formation process is the process whereby diaphragm layer 41 is formed on silicon substrate 20. A thin long silicon substrate that has been formed for line printers is used as silicon substrate 20. Thickness is, for instance, 200 $\mu$m so that height of the walls will not be too high. Diaphragm layer 41 is formed to a thickness of, for instance, 1 $\mu$m. Conventional thermal oxidation, etc., is used to produce the insulating layer. Furthermore, when zirconium oxide, etc., is used for the diaphragm, this sol can be applied to a specific thickness and then crystallized by hydrothermal synthesis later.

Figure 2B:
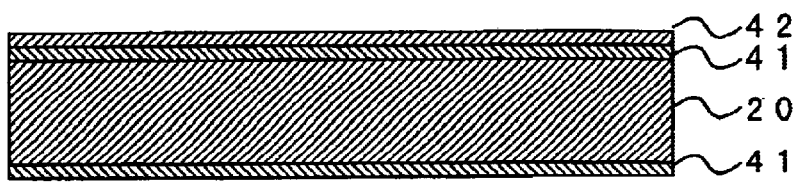

Bottom Electrode Layer Formation Process (FIG. 2B)

By means of the process of forming the bottom electrode layer, bottom electrode layer 42 is formed on diaphragm layer 41. A sol for forming the bottom electrode layer is first made. This sol is produced by dissolving tin chloride ($SnCl_2.H_2O$) to a specific concentration, for instance, 0.5 Mmol/l in ethanol and then doping it with zirconium isopropoxide ($Zr(O-i-C_3H_7)_4$) at a concentration of 1 to 2 mol % in terms of the tin. The method of producing the sol is not limited to the aforementioned method.

Next, the aforementioned sol is applied to diaphragm layer 41 by any application method, such as spin coating, die coating, spray coating, roll coating, etc. For example, after applying the sol to a thickness of 2 $\mu$m by spin coating, the product is heated for a specific amount of time (for instance, 10 minutes) at a specific temperature (for instance, 180° C.) in order to evaporate the solvent. The dry sol is then pyrolyzed for a specific amount of time (for instance, 10 minutes) at a specific temperature (for instance, 300° C.) in order to further eliminate organic matter that has mixed in the metal elements. The metal element Zr in the dopant acts to improve conductivity of bottom electrode layer 42 that has been treated and formed.

Figure 2C:
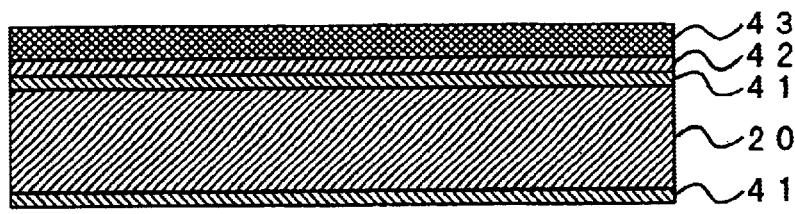

Piezoelectric Thin Film Layer Formation Process (FIG. 2C)

The piezoelectric thin film formation process is the process whereby a piezoelectric thin film layer made from several thin films is formed by repeatedly applying sol and then drying and pyrolyzing the sol. First, a sol for the piezoelectric ceramic that will be the starting material for the piezoelectric thin film layer is made. For instance, using 2-n-butoxyethanol as the main solvent, lead acetate trihydrate ($Pb(CH_3COO)_2.3H_2O$), titanium tetraisopropoxide ($Ti(CH_3CH_2CH_2O)_4$), magnesium pentaethoxyniobium ($Nb(OC_2H_5)_5$), tetra-n-propoxyzirconium ($Zr(O-n-C_3H_7)_4$) and magnesium acetate ($Mg(CH_3COO)_2.5H_2O$) are dissolved in a solvent to which iminodiethanol has been added to produce the piezoelectric sol. However, the method of producing the sol is not limited to this production method.

Next, the sol that has been produced as previously explained is applied to bottom electrode layer 42 to a specific thickness. Application can be performed by the aforementioned methods. For example, when spin coating is used, the sol is applied for 30 seconds at 500 rpm, for 30 seconds at 1500 rpm and finally, for 10 seconds at 500 rpm. Each metal atom comprising the PZT will be dispersed as organic complex during the application stage. Once application is completed, the product is dried for a specific time (for instance, 10 minutes) at a specific temperature (for instance, 180° C.). After drying, the product is pyrolyzed for a specific time (for instance, 10 minutes) at a specific temperature (for instance, 300° C.) in air. Each process of application of sol drying and pyrolyzing is repeated several times, for instance, 20 times, to build piezoelectric thin film layers 43 to a specific thickness (for instance, 2 $\mu$m) Multi-layering is done in order to prevent cracking while producing a thicker film.

Figure 2D:
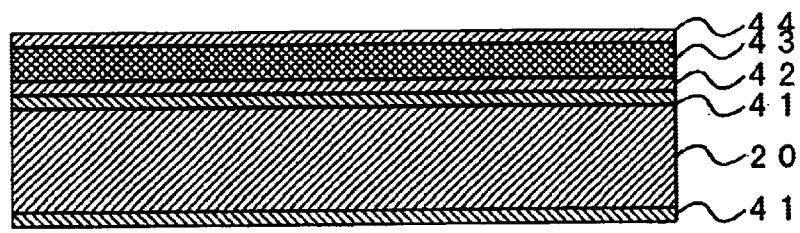

Top Electrode Layer Formation Process (FIG. 2D)

The top electrode formation process is a process whereby top electrode layer 44 is formed on piezoelectric thin film layer 43. Using the same sol as used to form the aforementioned bottom electrode layer, sol is applied to a specific thickness (for instance, 0.2 $\mu$m, by the same spin coating method as used for the bottom electrode formation process, etc. Moreover, the product is then dried and pyrolyzed as in the aforementioned bottom electrode formation process.

Figure 2E:
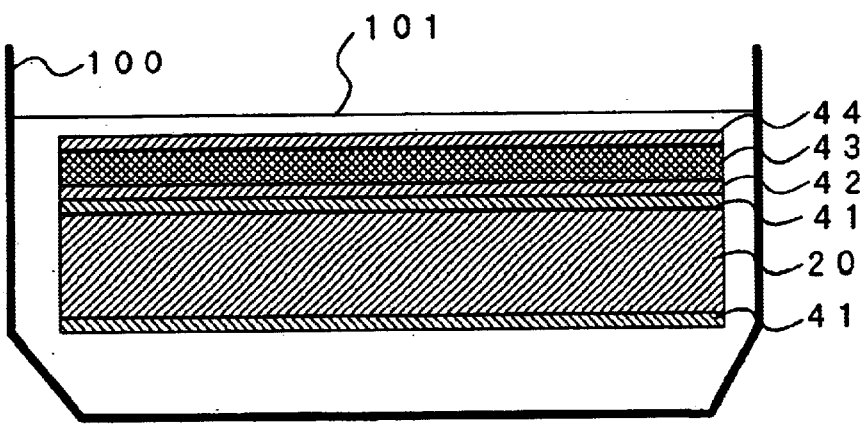

Hydrothermal Synthesis Process (FIG. 2E)

The hydrothermal treatment process is the process whereby crystallization of the aforementioned electrode layers and piezoelectric thin film layer are performed at the same time by heat treatment in a specific alkali solution. First, alkaline solution 101 is filled into tank 100 that is made so that pressure can be increased. The layer structure of the piezoelectric device that has been laminated by the aforementioned process is immersed in tank 100 and crystallization is promoted under specific conditions in an autoclave. The treatment solution can be any of KOH, $Ba(OH)_2$, a mixed solution of $Ba(OH)_2$ and $Pb(OH)_2$, or a mixed solution of KOH and $Pb(OH)_2$ as the solute when an alkaline solution is used. This is because it has been confirmed that piezoelectric ceramics crystallize in these alkaline solutions. The concentration of the alkali solution is adjusted to a concentration less than 2 Mmol/liter. If the concentration exceeds this concentration, the alkali will be strong and may corrode the piezoelectric thin film layer and substrate, etc. For instance, the concentration is adjusted to 0.5 Mmol/liter. The hydrothermal treatment temperature is set at 100 to 200° C. If temperature is lower than this range, crystallization will not be promoted and if temperature is higher than this range, etching of the piezoelectric thin film layer and silicon substrate will occur. For instance, treatment temperature is set at 140° C. The pressure of hydrothermal treatment is set between 2 $kg/cm^2$ to 10 $kg/cm^2$. If pressure is outside this range, good crystals will not be obtained. Pressure is set at, for instance, 4 kg/cm$^2$. The hydrothermal treatment time is between 10 minutes and 60 minutes. If treatment time is shorter, crystallization will not be complete and if the crystallization time is longer, there is a chance that the piezoelectric thin film layer and substrate will be eroded. For instance, treatment time is set at 30 minutes.

Crystallization of each layer is promoted by the aforementioned hydrothermal synthesis treatment. Each layer was laminated as is without being crystallized and therefore, there is a part at the interface between adjacent layers where the compositions of the two layers are mixed before this hydrothermal treatment. By submitting this mixed part to hydrothermal synthesis, crystal grains of each composition are formed and, as shown in FIG. 1, mixed layers 523 and 534 where the crystal grains of both layers are finely distributed are formed. Mixed layer 512 is also formed when the diaphragm layer is formed by sol application.

By means of the aforementioned process, the layer structure of the piezoelectric clement is completed. Since heat treatment to promote crystallization is not necessary in any of the aforementioned production processes, the number of processes as a whole is reduced. Therefore, cost is reduced. Moreover, piezoelectric device 40 that was produced by the aforementioned production method has mixed layers between the layers and therefore, adhesion between layers is extremely high. Consequently, there is no peeling of the layers and the yield of the production processes is improved. Moreover, there is no peeling between layers of the piezoelectric device that is the product and therefore reliability is improved and life can be prolonged.

In addition, in order to give the piezoelectric device the desired shape, the layer structure made as described above is formed into the desired shape by etching, etc., in accordance with the device in which the piezoelectric device will be used. By means of the present embodiment, the piezoelectric device is used as the actuator of an ink jet recording head and therefore, it will be further treated by the process shown in the cross section in FIG. 3.

Figure 3A:
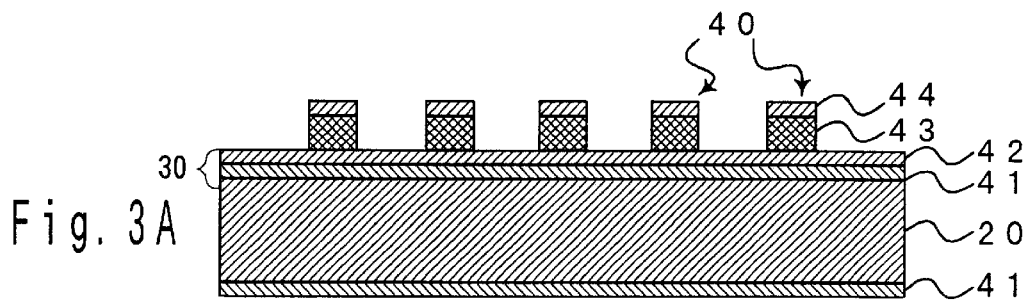
FIG. 3 is a cross section of the production process that describes the method of producing an ink jet recording head of the present invention.

Etching Process (FIG. 3A)

The etching process is the process whereby piezoelectric device 40 is formed. First, aforementioned the piezoelectric thin film layer 43 of the aforementioned piezoelectric device and top electrode layer 44 are masked so that they are the same shape as the cavity formed in pressure chamber substrate 20. Then etching is performed around this mask to obtain piezoelectric device 40. For more detail, resist material of a uniform thickness is applied by the spinner method, spraying, etc. Then a mask is formed to the shape of the piezoelectric device and exposure and development are performed to form a resist pattern on the top electrode layer 44. The mask is formed as needed, depending on whether the resist material is a positive resist or a negative resist. Moreover, top electrode layer 44 and piezoelectric thin film layer 43 is etched and removed by ion milling or dry etching, etc., which are normally used. Piezoelectric device 40 suitable for an ink jet recording head can be made as described above.

Figure 3B:
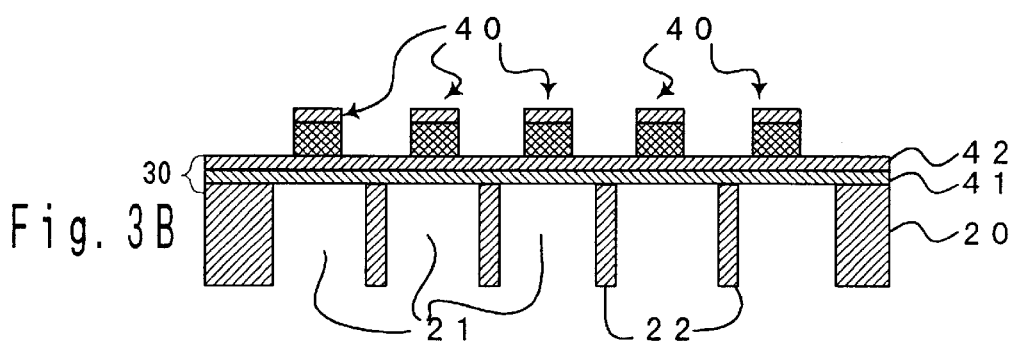

Pressure Chamber Formation Process (FIG. 3B)

The pressure chamber formation process is the process whereby cavity 21 is formed by etching on the other side of chamber pressure substrate 20 in which piezoelectric device 40 has been formed. For instance, anisotropic etching, anisotropic etching using an active gas, such as parallel plate-type reactive ion etching, etc., is used and etching of the space cavity 21 is performed from the opposite side of the surface where piezoelectric device 40 has been formed. The part that remains unetched becomes wall 22.

Figure 3C:
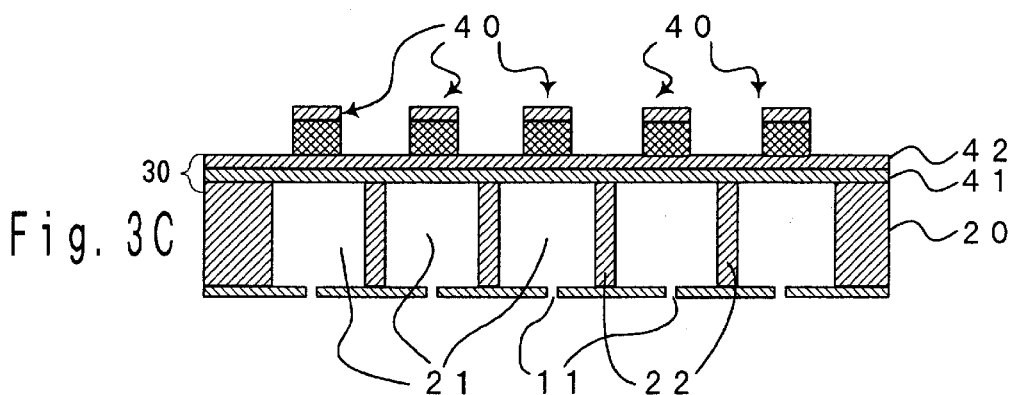

Nozzle Plate Gluing Process (FIG. 3C)

The nozzle gluing process is the process whereby nozzle plate 10 is glued with adhesive to silicon substrate 20 after etching. When glued together, each nozzle hole 11 is aligned so that it matches the empty space of each cavity 21. Finally, pressure chamber substrate 20 to which nozzle plate 10 is glued is attached to the receptacle and ink jet recording head 1 is completed.

Furthermore, when etching is performed on the nozzle plate and pressure chamber substrate as one unit, the process of gluing the nozzle plate is unnecessary. This is because the pressure chamber substrate is etched to a shape so that it will serve as both the nozzle plate and the pressure chamber plate and the nozzle holes will in the end match,the cavities.

EXAMPLES

A piezoelectric device with lead zirconate titanate (Pb(Zr $_{0.56}$Ti$_{0.44}$)O$_3$: PZT) as the piezoelectric thin film layers was made as Example 1 of the aforementioned production method. Starting at the top, the layer-built structure was top electrode layer SnO/piezoelectric thin film layer PZT/bottom electrode layer SnO/diaphragm layer SiO$_2$/pressure chamber substrate Si. Only the diaphragm layer was made by thermal oxidation. The rest of the layers were applied by spin coating. Crystallization of the electrode layer and the piezoelectric thin film layers was eventually performed by hydrothermal synthesis.

Moreover, a piezoelectric device wherein, starting from the top, the layer-built structure was top electrode film VO$_2$/piezoelectric thin film layer PZT/bottom electrode layer VO$_2$/diaphragm layer SiO$_2$/pressure chamber substrate Si was made as Example 2. By means of this example, the composition of the top electrode layer and the bottom electrode layer are different than the aforementioned SnO. Therefore, a sol was formed by dissolving triethoxyvanadyl (VO(OC$_2$H$_5$)$_3$) and titanium tetraisopropoxide (Ti(CH$_3$CH$_2$CH$_2$O)$_4$) as dopant in ethanol in place of the aforementioned SnO sol. The sol application method, etc., was the same as for the SnO electrode layer formation method.

Moreover, a piezoelectric device wherein, starting from the top, the layer-built structure was top electrode layer SnO/piezoelectric thin film layer PZT/bottom electrode layer SnO/diaphragm layer ZrO/pressure chamber substrate Si, was made as Example 1. By means of this example, the diaphragm layer was made by sol application instead of thermal oxidation. The sol used to form the diaphragm layer was made by dissolving tetra-n-propoxyzirconium (Ti(CH$_3$CH$_2$CH$_2$O)$_4$) in 2-n-butoxyethanol. The sol was repeatedly applied 10 times by spin coating to a diaphragm layer thickness of 1 μm. By means of the present example, the diaphragm layer was also formed from a sol and therefore, a mixed layer was also formed between the diaphragm layer and the bottom electrode layer.

By means of the aforementioned example, application was mainly by spin coating during the production processes and therefore, the method required fewer production equipment than conventional methods. Moreover, the only heat treatment was one hydrothermal treatment and therefore, the number of processes was reduced. Moreover, none of the film degradation due to repeated heat treatment that is seen with conventional methods was observed, proving that the production method of the present invention efficiently improves reliability.

Advantages a) By means of the present embodiment, almost all of the layers comprising the piezoelectric device are formed by application and therefore, there is no need to use many pieces of production equipment and a reduction in cost can be expected.

b) By means of the present embodiment, heat treatment is not applied every time a layer is formed. Hydrothermal synthesis treatment is performed once layering is completed and therefore, there is a reduction in the number of production processes and a reduction in cost can be expected.

c) By means of the present embodiment, the entire unit is crystallized all at once after each layer has been laminated before crystallization and therefore, there is a mixed layer where the compositions of two layers are mixed together between each layer. The crystals contained in the two layers are intricately intertwined in this mixed layer and as a result, adhesion between the layers is good and there is no peeling, etc. Consequently, yield is good during production and a reduction in cost can be expected. Moreover, as a product, reliability is good and life is long.

d) By means of the present embodiment, high-temperature heat treatment is not performed for the hydrothermal synthesis treatment and therefore, elements of the bottom electrode will not diffuse into the piezoelectric thin film and degradation of piezoelectric device properties can be prevented.

e) By means of the present embodiment, high-temperature heat treatment is not performed and therefore, there are no changes in properties and thermal stress is not applied to any of the films and reliability of the piezoelectric device and ink jet recording head can be improved.

f) By means of the present embodiment, high-temperature heat treatment is not necessary and therefore, the incidence of defects is low. Therefore, cost can be reduced.

g) By means of the present embodiment, little internal stress (including thermal stress) is produced because high-temperature heat treatment is not performed and therefore, even when a piezoelectric device with a large surface is produced, cracking will not occur. That is, an ink jet recording head that is suitable for large surface area printing equipment such as line printers, etc., can be presented.

Embodiment 2

Figure 4:
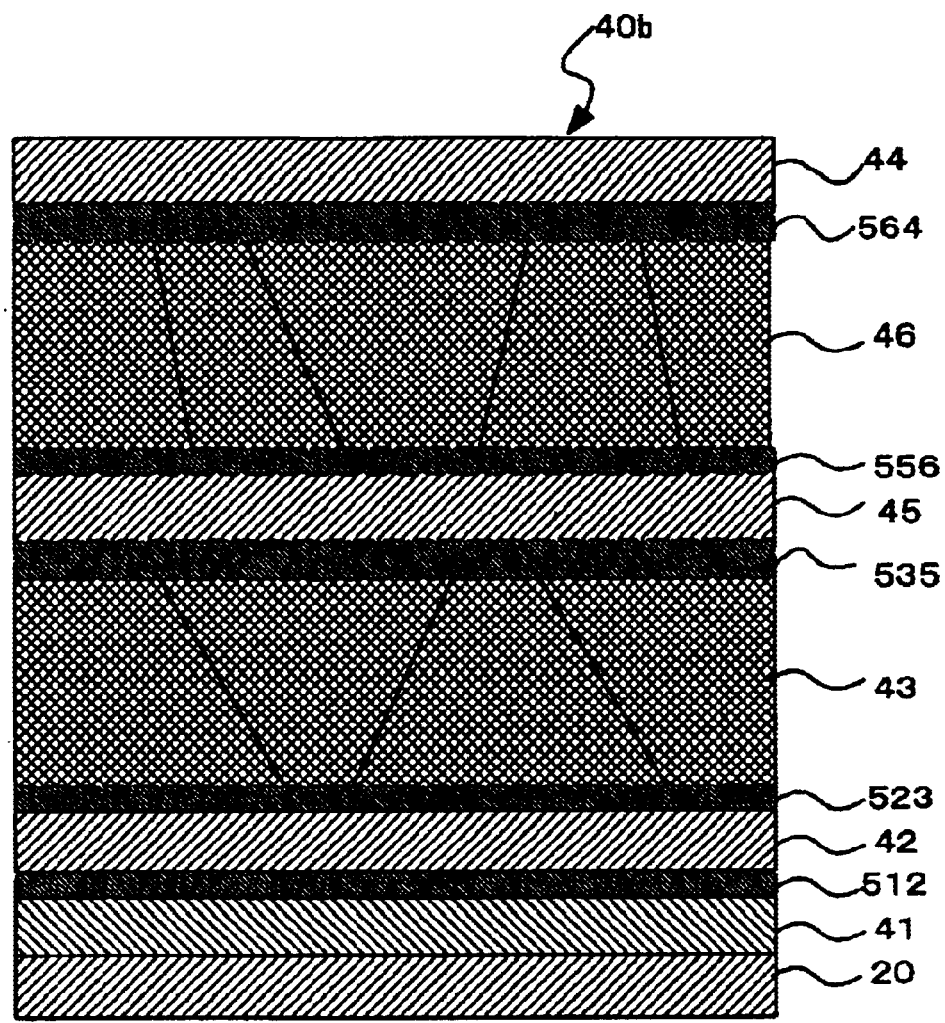
FIG. 4 is a cross section that describes the layer structure of the piezoelectric device of the second embodiment.

The present embodiment of the present invention pertains to a piezoelectric device with a layer-built structure as a so-called bimorph. FIG. 4 shows a cross section that describes the layer-built structure of the piezoelectric device of the present embodiment. The cross section is an enlarged view of the cross section of one piezoelectric device from the layer structure as seen from A—A in FIG. 6. The parts of the layer structure that are the same as in aforementioned Embodiment 1 are represented by the same symbol and their description here is omitted.

However, piezoelectric device 40b of the present embodiment further comprises middle layer 45 and piezoelectric thin film layer 46 between piezoelectric thin film layer 43 and top electrode layer 44, as shown in FIG. 4. This type of layer-built structure is generally called a bimorph and has the effect of diffusing strain.

Middle layer 45 is made by the same composition and production method as used for bottom electrode layer 42 and top electrode layer 44. For instance, it can be made from SnO or $VO_2$. Piezoelectric thin film layer 46 can be the same as piezoelectric thin film layer 43, or it can have a different composition and a different film thickness.

Mixed layer 535 is made between piezoelectric thin film layer 43 and middle layer 45, mixed layer 556 is made between middle layer 45 and piezoelectric thin film layer 46, and mixed layer 564 is made between piezoelectric thin film layer 46 and top electrode layer 44. These mixed layers are layers where crystals from the two layers sandwiching this mixed layer are mixed together, as explained in aforementioned Embodiment 1. Thickness of the mixed layer can be the same as explained in aforementioned Embodiment 1.

The process used to produce piezoelectric device 40 with the aforementioned layer-built structure can also be in accordance with aforementioned Embodiment 1. However, once the sol for piezoelectric thin film layer 43 has been applied and dried and pyrolyzed, middle layer 45 is formed by the same method as used for the top electrode in place of the top electrode layer. After middle layer 45 is formed, piezoelectric thin film 46 is further formed by the same method as used to form piezoelectric thin film layer 43. The hydrothermal synthesis process can be the same as used in aforementioned Embodiment 1. By means of this production process, each layer is laminated before crystallization and the materials in the two layers are mixed, after which crystallization is promoted by hydrothermal synthesis and therefore, production processes can be omitted and cost can be reduced. Adhesion between the layers is high because a mixed layer is present in between each layer and as a result, there is little peeling of layers. Consequently, yield can be improved during the production processes and reliability of the product can be improved and its life can be prolonged.

Furthermore, the present invention is not limited to the aforementioned layer structure, and it can have more layers. That is, by means of the aforementioned embodiment, there are 2 piezoelectric thin film layers, but there can be 3 or more layers. The electrode layers, including the middle layer, are increased by 1 layer every time the piezoelectric thin film layer is increased by one layer. In the end, there are n+1 electrode layers when there are n number (n is a natural number) of piezoelectric thin film layers. The method of aforementioned Embodiment 1 can be repeatedly used as the production method Other Modified Examples The present invention can be altered from the aforementioned embodiments and used. For instance, the aforementioned embodiments have dealt with piezoelectric devices as functional thin film, but they are not limited to these functional thin film and the present invention can be used with a general thin film structure with a specific function that is several thin films. Since there is a mixed layer between layers of different components, adhesion between two layers is extremely high and there is no peeling at the interface. Therefore, even if stress is applied to a thin film that is curved, the layer structure will remain intact and a functional thin film with high reliability that can resist changes over the years can be presented.

Moreover, the method of producing the functional thin film uses the method whereby the components of two layers are diffused by heat treatment to make a mixed layer wherein the components of the two layers are formed, etc.

The piezoelectric device used PZT, but it is also possible to crystallize other ferroelectric piezoelectric ceramics by hydrothermal methods.

The piezoelectric device made by the present invention can be used is not only a piezoelectric device for the aforementioned ink jet recording heads, but can also be used in the production of ferroelectric equipment, dielectric equipment, pyroelectric equipment, piezoelectric equipment, and photoelectric equipment, including nonvolatile semiconductor memory devices, thin film capacitors, pyroelectric detectors, sensors, surface acoustic wave optical guide tubes, optical memory devices, space optical modulators, diode laser frequency multipliers, etc. That is, the piezoelectric device of the present invention can have an increased surface area, making cost reduction possible. Moreover, it can be used for purposes not seen with conventional products and conventional functions can be presented less expensively.

By means of the present invention, there is a mixed layer that is a mixture of crystal structures between each of the layers and therefore, adhesion between layers is improved. Consequently, A very reliable, long-life functional thin film, piezoelectric device, and ink jet recording head and printer can be presented.

Moreover, by means of the present invention, the only process necessary for crystallization is hydrothermal synthesis, which is performed after many layers have been laminated and therefore, there are fewer total production process than with conventional methods. Consequently, it is possible to resent a method of producing piezoelectric devices and ink jet recording heads of reduced production cost.

The entire disclosure of Japanese Patent Applications No. 10-186679 filed on Jul. 1, 1998 and No. 11-163867 filed on Jun. 10, 1999 including specification, claims, drawings and summary are incorporated herein by reference in its entirety.

What is claimed is:

1. A method of producing a piezoelectric device having at least one piezoelectric thin film layer and at least two electrode layers, comprising the steps of:

forming at least one amorphous piezoelectric thin film layer, which is the amorphous state of said at least one piezoelectric thin film layer;

forming amorphous electrode layers, which are the amorphous state of each of said electrode layers; and crystallizing by hydrothermal synthesis as a whole all of said at least one amorphous piezoelectric thin film layers and all of said amorphous electrode layers after all of said at least one amorphous piezoelectric thin film layers and all of said amorphous electrode layers are laminated.

2. The method of producing a piezoelectric device according to claim 1, further comprising forming an amorphous crystalline diaphragm layer, which is the amorphous state of a diaphragm layer, wherein said crystallizing step is performed after all of said at least one amorphous piezoelectric thin film layers, all of said amorphous electrode layers, and said amorphous diaphragm layer are laminated and said crystallizing step is performed on said amorphous diaphragm layer, said amorphous piezoelectric film layer and said amorphous electrode layers.

3. The method of producing a piezoelectric device according to claim 1, wherein the step of forming said at least one amorphous piezoelectric thin film layer comprises a process whereby a precursor made from an organic metal solution is applied by a sol-gel method, a MOD method, or coprecipitation and a process whereby said precursor is dried and pyrolyzed.

4. The method of producing a piezoelectric device according to claim 3, wherein said process of drying and pyrolyzing said precursor comprises drying said precursor at 150 to 200° C. and then pyrolyzing the dry precursor at 300° C. to 500° C.

5. The method of producing a piezoelectric device according to claim 3, wherein said hydrothermal synthesis step comprises immersing said precursor that has been pyrolyzed in a specific alkaline solution to provide crystallization.

6. The method of producing a piezoelectric device according to claim 5, wherein said alkaline solution is selected from the group consisting of KOH, $Ba(OH)_2$, $Ba(OH)_2$+$Pb(OH)_2$ and KOH+$Pb(OH)_2$.

7. The method of producing a piezoelectric device according to claim 5, wherein said hydrothermal synthesis process is conducted at a temperature of 100 to 200° C. and a pressure of 10 atmospheres or less.

8. A method of producing a piezoelectric device having at least one piezoelectric thin film layer and at least two electrode layers, comprising the steps of:

forming at least one amorphous piezoelectric thin film layer, which is the amorphous state of said at least one piezoelectric thin film layer;

forming amorphous electrode layers, which are the amorphous state of each of said electrode layers; and crystallizing by hydrothermal synthesis as a whole all said at least one amorphous piezoelectric thin film layer and all of said amorphous electrode layers after all of said at least one amorphous piezoelectric thin film layers and all of said amorphous electrode layers are laminated, wherein the step of forming said amorphous piezoelectric thin film layer is repeated at least twice and the step of forming said amorphous electrode layer is repeated at least three times to produce a structure where each of said amorphous piezoelectric thin film layers is sandwiched by two of said amorphous electrode layers.

9. A method of producing an ink jet recording head comprising the steps of:

forming a diaphragm on one side of a substrate;

forming a piezoelectric device on said diaphragm having at least one piezoelectric thin film layer and at least two electrode layers, the step of forming said piezoelectric device comprising the steps of:

forming at least one amorphous piezoelectric thin film layer, which is the amorphous state of said at least one piezoelectric thin film layer;

forming amorphous electrode layers, which are the amorphous state of each of said electrode layers; and crystallizing by hydrothermal synthesis as a whole all of said at least one amorphous piezoelectric thin film layer and all of said amorphous electrode layers after all of said at least one amorphous piezoelectric thin film layers and all of said amorphous electrode layers are laminated; and etching said substrate such that the diaphragm with said piezoelectric device will form one side of a pressure chamber to form said pressure chamber.

* * * * *